United States Patent [19]

Nagatomo et al.

[11] 4,341,616
[45] Jul. 27, 1982

[54] DRY ETCHING DEVICE

[75] Inventors: Masao Nagatomo, Itami; Haruhiko Abe, Takarazuka; Kazuo Mizuguchi, Amagasaki, all of Japan

[73] Assignee: Mitsubishi Denki Kabushiki Kaisha, Tokyo, Japan

[21] Appl. No.: 215,185

[22] Filed: Dec. 11, 1980

[30] Foreign Application Priority Data

Jan. 25, 1980 [JP] Japan .................................. 55-8179

[51] Int. Cl.³ .......................... C23C 15/00; C23F 1/00
[52] U.S. Cl. ................................ 204/298; 204/192 E; 156/345
[58] Field of Search ............ 204/192 E, 192 EC, 298; 156/345, 643

[56] References Cited

U.S. PATENT DOCUMENTS 4,073,669 2/1978 Heinecke et al. .................... 156/643
4,209,357 6/1980 Gorin et al. .......................... 156/643
4,264,393 4/1981 Gorin et al. .......................... 156/345

FOREIGN PATENT DOCUMENTS 54-162969 12/1979 Japan .............................. 204/192 E
55-1132 1/1980 Japan .............................. 204/192 E
55-4937 1/1980 Japan .............................. 204/192 E Primary Examiner—Aaron Weisstuch
Attorney, Agent, or Firm—Robert E. Burns; Emmanuel J. Lobato; Bruce L. Adams

[57] ABSTRACT

A dry etching device is provided in which on at least one portion of the path of etchant movement from the plasma production region to the etching workpiece a resin coating containing atoms or molecules of the same type as the chemically active atoms or molecules which constitute the etchant, is formed.

7 Claims, 1 Drawing Figure

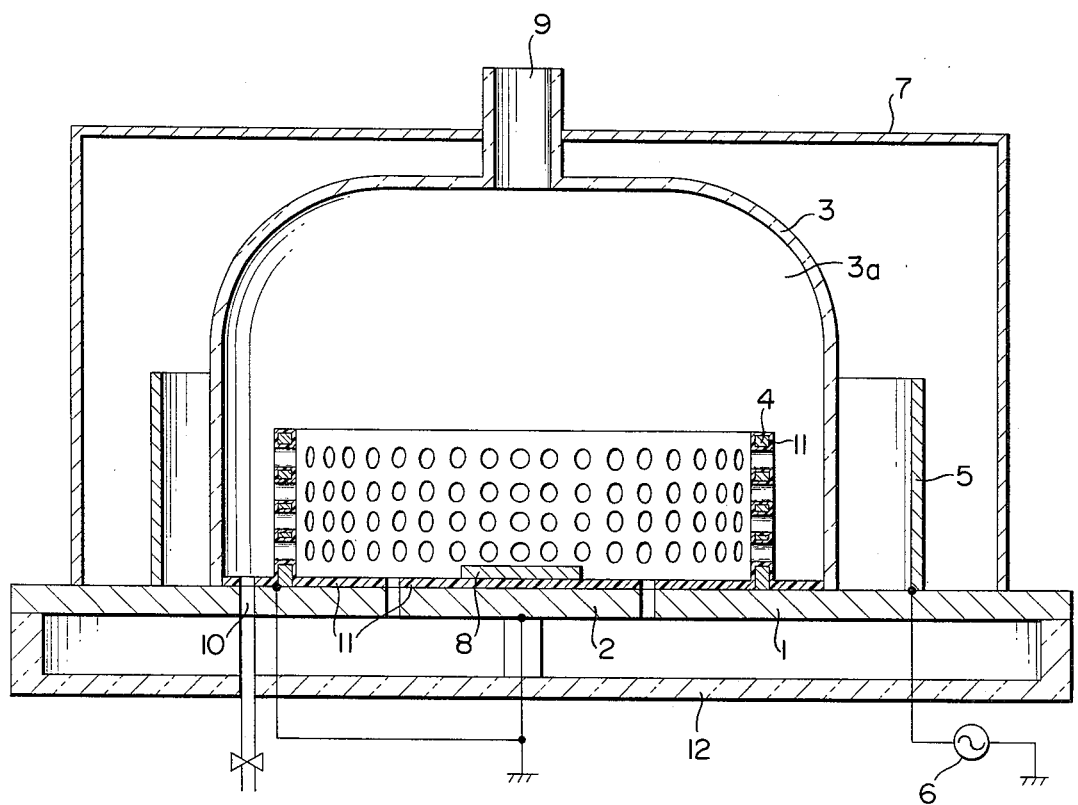

DRY ETCHING DEVICE

BACKGROUND OF THE INVENTION

1. Field of the Invention

This invention relates to dry etching devices.

2. Description of the Prior Art

Generally, when a reactant gas is introduced into a reduced pressure chamber and a high frequency electric field is applied to this, the reactant gas enters the plasma state and chemically active atoms or molecules are produced, these chemically active atoms or molecules functioning as an etchant, and so enabling an etching workpiece such as a semiconductor substrate to be etched.

In this kind of device, ordinarily the plasma production region and the etching workpiece positioning region are separated by a perforated or slotted first electrode having permeability to the atoms or molecules, and the chemically active atoms or molecules produced in the plasma production region reach the etching workpiece by passing through this first electrode, but if metal is exposed in this path of movement, they attach to the metallic surface and sputter the metallic surface, reducing the density of chemically active atoms or molecules, or discharge contaminants, leading to a reduction in etching speed.

Obviously, it is desirable to limit or prevent any such reduction in etchant density and hence etching speed, and to this end it might be proposed to coat those portions, particularly the metallic portions, in the path of etchant movement with a material, such as a resin, which would protect those portions from adherence and sputtering by the chemically active atoms or molecules. However, the present inventors have also considered that is desirable that the etchant density be increased, whereby the etching speed, too, might be increased beyond that which might be expected even if no interference or contamination were to occur.

SUMMARY OF THE INVENTION

An object of the present invention is to provide an etching device which does away with the aforementioned defects thereby to increase the etching speed.

It is another object of the present invention to provide an etching device wherein the etching speed is not deteriorated by sputtering by or adherence of the chemically active atoms or molecules to those portions, particularly the metallic portions, in the path of etchant movement.

It is a further object of the present invention to provide an etching device wherein the etching speed is increased beyond that which could be expected without any interference, by coating those portions in the path of etchant movement, particularly the metallic portions, with a resin material containing atoms or molecules of the same type as the chemically active atoms or molecules which constitute the etchant.

It is yet another object of the present invention to provide an etching device wherein the etchant density is not deteriorated by sputtering by or adherence of the chemically active atoms or molecules to those portions, particularly the metallic portions, in the path of etchant movement.

It is still another object of the present invention to provide an etching device wherein the etchant density is increased beyond that which could be expected without any interference, by coating those portions, particularly the metallic portions, in the path of etchant movement with a resin material containing atoms or molecules of the same type as the chemically active atoms or molecules which constitute the etchant.

It is yet a further object of the present invention to provide an etching device wherein contaminants are not discharged due to sputtering by or adherence of the chemically active atoms or molecules to those portions, particularly the metallic portions, in the path of etchant movement.

These objects are achieved according to this invention, by coating those portions, particularly the metallic portions, in the path of etchant movement with a resin material containing atoms or molecules of the same type as the chemically active atoms or molecules which constitute the etchant.

According to this invention, a substantially bell-shaped chamber, in which an etching workpiece such as a semiconductor substrate can be received, cooperates with a support member which is capable of supporting the etching workpiece, and at the upper region of the chamber is formed an exhaust outlet for reducing the pressure within the chamber, and at the lower region there is an inlet for introducing a reactant gas.

Also provided within the chamber in the region peripheral to the etching workpiece is a first electrode through which an etchant can pass, and opposing this first electrode is provided a second electrode outside the chamber, and across said two electrodes is impressed high frequency electric power.

On at least either one of said first electrode and the surfaces of said support member within the chamber, is formed a resin coating consisting of a resin material containing atoms or molecules which are of the same kind as the chemically active atoms or molecules which constitute the etchant.

BRIEF DESCRIPTION OF THE DRAWINGS

The FIGURE is a sectional view showing one embodiment of a dry etching device according to the present invention.

DESCRIPTION OF THE PREFERRED EMBODIMENT

Hereinbelow the present invention is explained with respect to an embodiment thereof and in conjunction with the appended drawing.

In the FIGURE, a metal peripheral support platform 1 surrounds a metal central support platform 2, with both support platforms being maintained on a device platform 12, and a substantially bell-shaped cylindrical case 3 forming a chamber 3a is maintained on platform 1. A permeable perforated first electrode 4 is grounded and positioned in a peripheral region within the chamber 3a, and a cylindrical second electrode 5 provided on the outside of said chamber 3a so as to oppose the first electrode 4, is connected to a high frequency power source 6, with a cover 7 covering all of these. An etching workpiece 8 such as a semiconductor substrate is supported on support platform 2. The pressure within the chamber 3a is reduced through exhaust outlet 9, and a reactant gas is introduced into the chamber 3a through inlet 10. A resin film 11 covers those exposed metal portions which form the path of movement of the chemically active atoms or molecules, namely the surface within the chamber 3a of the support platforms 1 and 2, as well as the entire surface of the first electrode 4, and when a fluorine containing gas is employed as the reactant gas, the coating is a fluorine containing resin, in this case, Teflon (trade name).

In the above described construction, the pressure within chamber 3a is reduced through exhaust outlet 9, and a fluorine containing reactant gas is introduced into chamber 3a through inlet 10, and then when high frequency electric power from a high frequency power source 6 is impressed across the electrodes 4 and 5 the reactant gas is excited and forms a plasma which produces chemically active atoms or molecules, the chemically active atoms or molecules constituting the etchant, which pass through the first electrode 4 to reach and etch the etching workpiece 8.

Then, due to the high frequency electric field, or the sputtering effect of the fluorine plasma gas, chemically active fluorine atoms or molecules are released from the resin coating 11, and the density of fluorine atoms or molecules constituting the etchant in the plasma gas is increased, with the result that the etching speed with regard to the etching workpiece 8 can be increased.

For example, when carrying out etching with an etching workpiece 8 of silicon (Si) or silicon nitride (SiN), using freon gas ($CF_4$) as the fluorine gas, and impressing high frequency power at about 200 W under a gas pressure of 0.1~2 Torr, it was possible to raise the speed of etching of the etching workpiece 8 by two to five times.

In the aforementioned embodiment, a fluorine containing gas is used as the reactant gas, the etchant consists of chemically active fluorine atoms or molecules, and the resin coating is a fluorine containing resin, but other gases which are capable of etching the etching workpiece, such as for example a chlorine containing gas such as $CCl_4$, can also be used as the reactant gas and, consequently, a resin containing chemically active atoms or molecules supplied from the reactant gas, namely, in the case of a chlorine containing gas, a chlorine containing resin, would be used as the resin coating.

As explained in detail hereinabove, when, according to the present invention, the path of movement of the etchant from the plasma production region to the etching workpiece is coated with a resin containing atoms or molecules of the same kind as the etchant, it is possible to increase the density of the chemically active atoms or molecules, and thereby the etching speed can be increased, and at the same time, obviously, the deterioration causing effects of adhesion to or sputtering of exposed metallic portions is completely avoided.

What is claimed is:

1. A dry etching device comprising:
   a support member which is capable of supporting at least an etching workpiece;
   a case forming, in cooperation with the support member, a chamber which is capable of receiving said etching workpiece;
   a first electrode having plasma permeability and which is provided within said chamber in a region peripheral to said etching workpiece;
   a second electrode provided outside said chamber so as to oppose said first electrode;
   an exhaust outlet provided on said chamber for reducing the pressure within said chamber;
   reactant gas supply means including an inlet for introducing a reactant gas into said chamber;
   a high frequency power source for producing a high frequency electrical field between said two electrodes to turn said reactant gas into an etchant plasma containing chemically active atoms and molecules; and
   a resin coating consisting of resin material containing atoms or molecules of the same type as the chemically active atoms or molecules which constitute the etchant, formed on at least one of the surfaces of said first electrode and the surfaces of said support member within the chamber, said resin coating protecting said surfaces on which it is coated to prevent sputtering of said surfaces, and said coating atoms or molecules of the same type as the chemically active atoms which constitute the etchant being sputtered by the etchant for increasing the quantity of etchant within said chamber to speed etching of a workpiece on said support member.

2. A dry etching device as claimed in claim 1, wherein the etchant comprises chemically active fluorine atoms or molecules, and said resin coating is a fluorine containing resin.

3. A dry etching device as claimed in claim 1, wherein the etchant comprises chemically active chlorine atoms or molecules, and the resin coating is a chlorine containing resin.

4. A dry etching device as claimed in any one of claims 1, 2 or 3, wherein said support member consists of a central support platform for supporting said etching workpiece, and a peripheral support platform for supporting said case.

5. A dry etching device as claimed in any one of claims 1, 2 or 3, wherein said support member is a metallic member.

6. A dry etching device as claimed in claim 4, wherein said support member is a metallic member.

7. A dry etching device as claimed in claim 1, wherein said resin coating is provided on said first electrode and the surfaces of said support member within said chamber.

* * * * *